(12) United States Patent
Brady et al.

(10) Patent No.: US 11,070,149 B2
(45) Date of Patent: *Jul. 20, 2021

(54) SYSTEM FOR CONVERTING ELECTROMAGNETIC RADIATION TO ELECTRICAL ENERGY USING METAMATERIALS

(71) Applicant: Redwave Energy, Inc., Boulder, CO (US)

(72) Inventors: Patrick K. Brady, Longmont, CO (US); Dale K. Kotter, Shelley, ID (US); Wounjhang Park, Superior, CO (US)

(73) Assignee: Redwave Energy, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/529,976

(22) Filed: Aug. 2, 2019

(65) Prior Publication Data

US 2019/0356247 A1     Nov. 21, 2019

Related U.S. Application Data

(63) Continuation of application No. 14/745,299, filed on Jun. 19, 2015, now Pat. No. 10,374,524.

(Continued)

(51) Int. Cl.
*H01L 31/00*     (2006.01)
*H02N 11/00*     (2006.01)
(Continued)

(52) U.S. Cl.
CPC ............ *H02N 11/002* (2013.01); *G02B 1/002* (2013.01); *H01L 31/00* (2013.01);
(Continued)

(58) Field of Classification Search
CPC ......... H01Q 1/248; G02B 1/002; H01L 31/00
(Continued)

(56) References Cited

U.S. PATENT DOCUMENTS 2,498,461 A    2/1950   Skellett
4,888,061 A   12/1989   Wenz
(Continued)

FOREIGN PATENT DOCUMENTS

CN    102904045    1/2013
JP    2002-78365   3/2002
(Continued)

OTHER PUBLICATIONS

Australian Patent Office: Patent Examination Report No. 1 dated May 6, 2016 in Australian Patent Application 2012347504.
(Continued)

*Primary Examiner* — Ramon M Barrera
(74) *Attorney, Agent, or Firm* — David C. Isaacson; Fitzgerald & Isaacson, LLP

(57) ABSTRACT

Spectral tuning of heat source to emit radiation at a desired frequency or frequency band is accomplished using metamaterials. The metamaterials include a structured geometry having holes with dimensions and spacing chosen such that the resulting surface will emit radiation in the desired spectrum. A collector can be made of a similar metamaterial or antenna array to detect the emitted radiation and transfer it to a converter device that converts the detected radiation to electricity. Embodiments also provide efficient coupling to the converter device for energy harvesting. Cooling of the converter devices can be accomplished using a cooling sink or deep space.

28 Claims, 11 Drawing Sheets

Related U.S. Application Data

(60) Provisional application No. 62/015,121, filed on Jun. 20, 2014.

(51) Int. Cl.
*G02B 1/00* (2006.01)
*H01Q 1/24* (2006.01)
*H01L 31/0264* (2006.01)
*H01L 31/04* (2014.01)

(52) U.S. Cl.
CPC .......... *H01L 31/0264* (2013.01); *H01L 31/04* (2013.01); *H01Q 1/248* (2013.01); *Y02E 10/52* (2013.01)

(58) Field of Classification Search
IPC .......... H01Q 1/248; H01L 31/00; G02B 1/002
See application file for complete search history.

(56) References Cited

U.S. PATENT DOCUMENTS

| | | | |
|---|---|---|---|
| 5,043,739 | A | 8/1991 | Logan et al. |
| 5,269,851 | A | 12/1993 | Horne |
| 5,450,053 | A | 9/1995 | Wood |
| 5,455,594 | A | 10/1995 | Blasing et al. |
| 6,534,784 | B2 | 3/2003 | Eliasson et al. |
| 7,329,871 | B2 | 2/2008 | Fan et al. |
| 7,436,373 | B1 | 10/2008 | Lopes et al. |
| 7,468,525 | B2 | 12/2008 | Avanzino et al. |
| 7,792,644 | B2 | 9/2010 | Kotter et al. |
| 8,071,931 | B2 | 12/2011 | Novack et al. |
| 8,115,683 | B1 | 2/2012 | Stefanakos et al. |
| 8,283,619 | B2 | 10/2012 | Novack et al. |
| 8,847,824 | B2 | 9/2014 | Kotter et al. |
| 8,901,507 | B2 | 12/2014 | Kotter |
| 10,323,980 | B2 | 6/2019 | Sxena et al. |
| 2003/0128919 | A1 | 7/2003 | Weiss et al. |
| 2006/0210279 | A1 | 9/2006 | Hillis et al. |
| 2006/0283539 | A1 | 12/2006 | Slafer |
| 2008/0136563 | A1 | 6/2008 | Duewl et al. |
| 2009/0026434 | A1 | 1/2009 | Malhotra et al. |
| 2009/0125254 | A1 | 5/2009 | Kotter et al. |
| 2009/0277490 | A1 | 11/2009 | Chu |
| 2010/0045924 | A1 | 2/2010 | Powers et al. |
| 2010/0270967 | A1 | 10/2010 | Cho et al. |
| 2010/0319749 | A1 | 10/2010 | Greiff et al. |
| 2010/0284086 | A1 | 11/2010 | Novack et al. |
| 2010/0289342 | A1 | 11/2010 | Maness |
| 2011/0062329 | A1 | 3/2011 | Ben-Bassat |
| 2011/0160542 | A1 | 6/2011 | Ahn |
| 2011/0164308 | A1 | 7/2011 | Arsenault et al. |
| 2011/0277805 | A1 | 11/2011 | Novack et al. |
| 2011/0315880 | A1 | 12/2011 | Nemirovsky |
| 2012/0080073 | A1 | 4/2012 | Kotter et al. |
| 2012/0241616 | A1 | 9/2012 | Axelrod et al. |
| 2013/0009851 | A1 | 1/2013 | Danesh |
| 2013/0141190 | A1 | 6/2013 | Kitaoka et al. |
| 2013/0146117 | A1 | 6/2013 | Brady |
| 2013/0249771 | A1 | 9/2013 | Kotter et al. |
| 2014/0172374 | A1 | 6/2014 | Brady |
| 2014/0231648 | A1 | 8/2014 | Kotter |
| 2014/0266967 | A1 | 9/2014 | Ramahi et al. |
| 2014/0373535 | A1* | 12/2014 | Moddel .......... F03G 6/001 60/641.8 |
| 2015/0229165 | A1 | 8/2015 | Hanein et al. |
| 2015/0303335 | A1 | 10/2015 | Kotter |
| 2016/0126441 | A1 | 5/2016 | Brady |
| 2016/0181868 | A1 | 6/2016 | Casse et al. |

FOREIGN PATENT DOCUMENTS

| | | |
|---|---|---|
| JP | 4835334 | 3/2002 |
| JP | 2013-197181 | 9/2013 |
| JP | 2014-023609 | 2/2014 |
| WO | 2011116463 | 9/2011 |
| WO | 2012008551 | 1/2012 |
| WO | 2014100707 | 6/2014 |

OTHER PUBLICATIONS

Chinese Patent Office: content of first office action dated Dec. 17, 2015 for Chinese Patent App. No. 201280060548.4 (in Chinese).
Chinese Patent Office: content of first office action dated Dec. 17, 2015 in Chinese Patent App. No. 201280060548.4 (in English for portion for which translation was available).
Chinese Patent Office: content of first office action dated Dec. 1, 2017 for Chinese patent app. No. Patent App. No. 201580033161.3 (in Chinese).
Chinese Patent Office: content of first office action dated Dec. 1, 2017 in Chinese Patent App. No. 201580033161.3 (in English for portion for which translation was available).
Chinese Patent Office: content of second office action dated Aug. 1, 2016 in Chinese Patent App. No. 201280060548.4 (in English for portion for which translation was available).
Chinese Patent Office: content of second office action dated Aug. 1, 2016 for Chinese Patent App. No. 201280060548.4 (in Chinese).
Chinese Patent Office: Notice of first office action dated Dec. 1, 2017 in Chinese Patent App. No. 201580033161.3 (in Chinese), 2 pages.
Chinese Patent Office: Notice of first office action dated Dec. 17, 2015 in Chinese Patent App. No. 201280060548.4 (in Chinese), 2 pages.
Chinese Patent Office: Notice of second office action dated Aug. 1, 2016 in Chinese Patent App. No. 201280060548.4 (in Chinese), 2 pages.
Chinese Patent Office: Search report dated Dec. 17, 2015 in Chinese Patent App. No. 201280060548.4 (in Chinese).
Chinese Patent Office: content of third office action dated Feb. 13, 2017 for Chinese patent app. No. Patent App. No. 201280060548.4 (in Chinese).
Chinese Patent Office: content of third office action dated Feb. 13, 2017 in Chinese Patent App. No. 201280060548.4 (in English for portion for which translation was available).
Chinese Patent Office: Notice of third office action dated Feb. 13, 2017 in Chinese Patent App. No. 201280060548.4 (in Chinese).
Chinese Patent Office: notice of rejection dated Aug. 17, 2017 for Chinese Patent App. No. 201280060548.4 (in Chinese).
Chinese Patent Office: notice of rejection dated Aug. 17, 2017 in Chinese Patent App. No. 201280060548.4 (in English for portion for which translation was available).
Chinese Patent Office: Search report dated Dec. 1, 2017 in Chinese Patent App. No. 201580033161.3 (in Chinese).
Chinese Patent Office: content of fourth office action dated May 10, 2018 for Chinese patent app. No. Patent App. No. 201280060548.4 (in Chinese).
Chinese Patent Office: content of fourth office action dated May 10, 2018 in Chinese Patent App. No. 201280060548.4 (in English for portion for which translation was available).
Chinese Patent Office: Notice of fourth office action dated May 10, 2018 in Chinese Patent App. No. 201280060548.4 (in Chinese).
Canadian Patent Office: Office Action dated Aug. 29, 2018 in CA Pat. App. No. 2,858,375.
Japanese Patent Office: Office Action dated Jul. 17, 2018 in JP Pat. App. No. 2017-139220 (in Japanese).
Japanese Patent Office: Office Action dated Jul. 17, 2018 in JP Pat. App. No. 2017-139220 (in English for portion for which translation was available).
Japanese Patent Office: Office Action dated Dec. 2, 2016 in JP Pat. App. No. 2014-546142 (in Japanese).
Japanese Patent Office: Office Action dated Dec. 2, 2016 in JP Pat. App. No. 2014-546142 (in English for portion for which translation was available).
Japanese Patent Office: Office Action dated Mar. 18, 2019 in JP Pat. App. No. 2017-519465 (in Japanese).

(56) References Cited

OTHER PUBLICATIONS

Japanese Patent Office: Office Action dated Mar. 18, 2019 in JP Pat. App. No. 2017-519465 (in English for portion for which translation was available).
Canadian Patent Office: Office Action dated Aug. 19, 2019 in CA Pat. App. No. 2,858,375.
Chinese Patent Office: Search report dated Dec. 16, 2019 in Chinese Patent App. No. 201910255392.9 (in Chinese).
Chinese Patent Office: content of first office action dated Dec. 30, 2019 for Chinese Patent App. No. 201910255392.9 (in Chinese).
Chinese Patent Office: content of first office action dated Dec. 30, 2019 in Chinese Patent App. No. 201910255392.9 (in English for portion for which translation was available).
Chinese Patent Office: Notice of first office action dated Dec. 30, 2019 in Chinese Patent App. No. 201910255392.9 (in Chinese).
EPO Communication in European App. No. 12855658.6 dated Dec. 9, 2019.
Australian Patent Office: Patent Examination Report No. 1 dated Feb. 27, 2020 in Australian Patent Application 2015276815.
Canadian Patent Office: Office Action dated Aug. 12, 2020 in CA Pat. App. No. 2,858,375.
Korean Patent Office: Office Action dated Jul. 10, 2020 in Korean patent application No. 10-2017-7001748 along with English translation thereof.
JP 2002-78365 (Toyota Motor Company) (Mar. 15, 2002) (Machine translation to English).
JPB 4835334 (Univesity of Tokushima Ryukoku University) (Mar. 15, 2002) (Machine translation to English).
JP 2014-023609 (University of Tokushima Ryukoku University) (Feb. 3, 2014) (Machine translation to English).
JP 2013-197181 (Asahi Kasei Corporation) (Sep. 30, 2013) (Machine translation to English).
Advisory Action dated Apr. 18, 2017 in U.S. Appl. No. 13/708,481, filed Dec. 7, 2012.
B. Monacelli, J. Pryor, B. A. Munk, D. Kotter, and G. D. Boreman, "Infrared frequency selective surface based on circuit-analog square loop design," IEEE Transactions on Antennas and Propagation, vol. 53, No. 2, pp. 745-752, Feb. 2005.
Celanovic, I., et al. "Two-dimensional tungsten photonic crystals as selective thermal emitters," Applied Physics Letters 92, pp. 193101-1-3 (2008).
Extended European Search Report in European App. No. 12855658.6 dated Jul. 20, 2015.
International Search Report for International Application No. PCT/US2013/077561 dated Mar. 27, 2015, 2 pages.
International Search Report dated Sep. 4, 2015 in PCT App. No. PCT/US2015/036817, filed Jun. 19, 2015.
International Search Report dated Aug. 15, 2014 in PCT App. No. PCT/US2014/017843, filed Feb. 21, 2014.
International Search Report dated Feb. 15, 2013 in PCT App. No. PCT/US2012/068561, filed Dec. 7, 2012.
Kotter et al., "Lithographic Antennas for Enhancement of Solar-Cell Efficiency," Idaho Nat'l Eng'g. Lab., INEE/EXT-98-00389, Apr. 1998, 26 pages.
Kotter et al., "Theory and manufacturing processes of solar nanoantenna electromagnetic collectors," Journal or Solar Energy Engineering, ASME International US, vol. 132, No. 1, Feb. 1, 2010 (Feb. 1, 2010), pp. 11014-1-11014-9.
Notification of Transmittal of International Search Report and Written Opinion of International Searching Authority dated Aug. 15, 2014 in PCT App. No. PCT/US2014/017843, filed Feb. 21, 2014.
Notification of Transmittal of International Search Report and Written Opinion of International Searching Authority dated Feb. 15, 2013 in PCT App. No. PCT/US2012/068561, filed Dec. 7, 2012.
Notification of Transmittal of International Search Report and Written Opinion of International Searching Authority, or the Declaration dated Sep. 4, 2015 in PCT App. No. PCT/US2015/036817, filed Jun. 19, 2015.
Office Action dated Dec. 15, 2015 in U.S. Appl. No. 13/708,481, filed Dec. 7, 2012.
Office Action dated Feb. 7, 2017 in U.S. Appl. No. 13/708,481, filed Dec. 7, 2012.
Office Action dated Jul. 15, 2016 in U.S. Appl. No. 13/708,481, filed Dec. 7, 2012.
Office Action dated Jun. 23, 2017 in U.S. Appl. No. 13/708,481, filed Dec. 7, 2012.
Office Action dated May 5, 2015 in U.S. Appl. No. 13/708,481, filed Dec. 7, 2012.
Remski et al., "Frequency Selective Surfaces," Design and Analysis Using the Ansoft Produce Suite, Ansoft Corp., Presentation #4, 34 pages, 2000.
Shelton, David, "Tunable Infrared Metamaterials," University of Central Florida STARS, Electronic Theses and Dissertations, Paper 4269 (2010).
Shelton, et al., "Gangbuster frequency selective surface metamaterials in terahertz band," Elctronics Letters, vol. 44, No. 22, pp. 1-2 (Oct. 23, 2008).
U.S. Appl. No. 60/987,630, filed Nov. 13, 2007, titled, "Antenna Devices Comprising Flexible Substrates, Related Structures, and Methods of Making and Using the Same," to Pinhero, et al.
Written Opinion for International Application No. PCT/US2013/077561 dated Mar. 27, 2015, 2 pages.
Written Opinion of the International Searching Authority dated Aug. 15, 2014 in PCT App. No. PCT/US2014/017843, filed Feb. 21, 2014.
Written Opinion of the International Searching Authority dated Sep. 4, 2015 in PCT App. No. PCT/US2015/036817, filed Jun. 19, 2015.
Written Opinion of the International Searching Authority dated Feb. 15, 2013 in PCT App. No. PCT/US2012/068561, filed Dec. 7, 2012.
Extended European Search Report in European App. No. 15808962.3 dated Feb. 8, 2018.
Yunsong, Xie, et al., "A Universal Electromagnetic Energy Conversion Adapter Based on a Metamaterial Absorber," Dec. 3, 2013.
Grover et al., "Traveling-Wave Metal/Insulator/Metal Diodes for Improved Infrared Bandwidth and Efficiency of Antenna-Coupled Rectifiers", IEEE Transactions on Nanotechnology,, vol. 9, No. 6, pp. 716-722, Nov. 1, 2010 (Nov. 1, 2010).
EPO Communication under Rule 71(3) dated May 7, 2020.

* cited by examiner

SYSTEM FOR CONVERTING ELECTROMAGNETIC RADIATION TO ELECTRICAL ENERGY USING METAMATERIALS

This application is a continuation of U.S. application Ser. No. 14/745,299, filed Jun. 19, 2015 (pending), which claims the benefit of U.S. Provisional Application No. 62/015,121, filed Jun. 20, 2014 (expired), each of which is hereby incorporated by reference herein in its entirety.

BACKGROUND

Field of the Invention

Embodiments of the present invention relate generally to structures and methods for harvesting energy from electromagnetic radiation and, more specifically, to nanostructures, metamaterials and related methods and systems for harvesting energy from, for example, infrared, near infrared and visible spectrums and capturing millimeter waves and Terahertz energy.

Background of the Invention

There is a great need for inexpensive renewable energy in the world right now. Ironically, there is an abundance of energy available in the form of sunlight and heat but using it to support the needs of society requires it to be converted into electrical form. Most electrical energy used today comes from a conversion process involving heat. Nuclear, coal, diesel, and natural gas powered electrical generation plants all convert stored forms of energy into heat for conversion into electricity. Processes in these plants are inefficient and often produce more heat as waste than is converted into electricity.

Harvesting sources of heat into usable electrical power is especially desirable at low cost. The cost of turbine based solutions is well established at this point. As a result, new technological solutions for converting heat to electrical power enter a relatively mature environment. Because of the need and the fixed pricing environment, new technologies are beginning to address this area. These new technologies include thermo photovoltaic (TPV), thermoelectric (TE) and organic rankine cycle (ORC) systems.

TPV technology has encountered difficulties with heat conversion applications since photovoltaic (PV) converts short wave radiation, not the long waves found in the infrared (IR) and near IR spectra associated with heat. New micron gap methods for bringing such long wave energy to the PV cell still require conversion technology better suited to this influx of long wave radiation. The PV cell band gap favors only energetic photons since lower energy photons do not have the energy to surmount the gap and end up absorbed, thereby causing heat in the PV cell.

Thermoelectric has only been able to convert heat to electrical power at low efficiency. To date, TE applications for converting heat to electricity has been unable to provide substantial efficiencies in energy conversion. Despite these hurdles, TE has been used in automotive waste heat recovery, which further demonstrates the need for alternative heat-to-electric conversion technologies.

Organic Rankine Cycle technology harvests waste heat by chaining turbines together with heat exchangers each with a lower boiling point liquid in its system. Unfortunately, ORC systems are bulky and have large numbers of moving parts. They are also limited to the properties of the liquids and ultimately the limit of time, space and marginal results of additional systems in a working space.

BRIEF SUMMARY OF THE INVENTION

The technology of surfaces of paired nanoantenna and diode arrays present tremendous advantages for energy harvesting applications. In the area of waste heat recovery these systems are ideal since they have no moving parts, are inexpensive to manufacture and can be tuned to the frequency spectra of the target source. The ability to tune the collecting elements of the system to the spectral properties of the source make these technologies ideal not only for waste heat applications but for heat harvesting in general and, ultimately, solar energy harvesting as well.

Embodiments described herein involve a method for tuning to the spectral properties of a heat source using metamaterial designs. The combination of collector and source tuning make this a powerful method for harvesting energy from a variety of sources. Beyond tuning of source and collecting elements, embodiments described herein use methods that enable thermal energy to be efficiently coupled into nanostructures for energy harvesting.

In embodiments, a metamaterial device acts as converter between propagating and localized electromagnetic fields, providing an effective route to couple photons into the antenna-based energy harvesters. This structure can exceed the black body radiation limit. The collector array components of these systems are called Nanoantenna Electromagnetic Collectors (NEC).

Various nanostructure-based metamaterial surface treatments have been developed to enhance energy capture from thermal heat sources. Metamaterial layers tune the thermal emissions of a hot body to radiate energy in the channels optimized for high efficiency energy conversion. Methods are demonstrated for affordable, large-scale fabrication of the device.

Embodiments of the present invention also include systems and methods to harvest electromagnetic radiation from far-field plane waves, to harvest EM radiation from near-field evanescent and/or plasmonic waves, and to harvest electromagnetic radiation using a combination of far- and near-field effects. Systems and apparatus for energy capture and concentration include resonant antenna structures and metamaterial films. Systems and apparatus for energy conversion include various types of rectification processes integrated with the antenna device, which is also referred to herein as a rectenna. Energy conversion apparatus and methods include, but are not limited to: metal-insulator-metal (MIM), metal-insulator-insulator-metal (MIIM), and Traveling Wave Diode (TWD) diode devices.

In an embodiment, the present invention is an energy harvesting system that includes resonant elements tuned to frequencies in the range of available radiant energy. Typically, such frequencies are in the frequency range from approximately 10 THz, in the infrared, to over 1000 THz (visible light). In an embodiment, these resonant elements are composed of electrically conductive material, and coupled with a transfer element. The transfer element converts stimulated electrical energy in the resonant element to direct current, to form resonant and transfer element pairs. In an embodiment, the resonant element and transfer element pairs are arranged into arrays that are embedded in a substrate and interconnected to form a power source, for example, for an electrical circuit or other apparatus or device requiring sourced electrical energy to operate. Additional details for resonant and transfer elements of embodiments are described in U.S. patent application Ser. No. 13/708,481, filed Dec. 7, 2012, entitled, "System and Method for Converting Electromagnetic Radiation to Electrical Energy," (U.S. Pat. App. Pub. No. US 2013/0146117) (the "'481 Application"), U.S. patent application Ser. No. 14/108,138, filed Dec. 16, 2013, entitled, "System and Method for Identifying Materials Using a THz Spectral Fingerprint in a Media with High Water Content" (U.S. Pat. Pub. No. U.S. 2014/0172374) (the "'138 Application"), and U.S. patent application Ser. No. 14/187,175, filed Feb. 21, 2014, entitled, "Structures, System and Method for Converting Electromagnetic Radiation to Electrical Energy" (copy attached to U.S. Provisional App. 62/015,121 as Appendix A, which is hereby incorporated by reference herein in its entirety) (the "'175 Application"), each of which is hereby incorporated by reference herein in its entirety.

In addition to the resonant and transfer elements described above, in an embodiment, the surface of the material is modified to be a metamaterial. The metamaterial enables the surface to radiate energy that matches the spectrum of the NEC components that will harvest it. In an embodiment, the metamaterial comprises a grid of holes of specific depth, area, and spacing. These holes produce an artificial surface resonance at a specific frequency. This operation is similar to surface plasmons on metal surfaces. The electromagnetic field is concentrated over the holes where NEC devices may be placed. Furthermore, the energy available for harvesting is most concentrated in the near field, which is defined as the region within the light wavelength from the surface. In one embodiment, a NEC is placed 3 μm above each hole and the surface and NEC are tuned to 1 THz. In another embodiment, a NEC is placed in the near-field over each hole at less than 0.5 wavelengths of the specific frequency that causes surface resonance. In embodiments, a NEC is placed over some, but not all of the holes. In an embodiment, the specific dimensions of holes and hole placement are determined by computer simulations based on the Maxwell's equations describing the interaction between light and material. For example, in an embodiment, hole spacing is 50 μm, hole diameter is 10 μm and hole depth is 40 μm. The simulation software used was COMSOL available from COMSOL, Inc. and Lumerical, available from Lumerical Solutions, Inc.

In an embodiment, components, elements and substrate of the device are composed of metals and materials that allow them to be manufactured in low cost methods such as roll-to-roll.

In an embodiment, the present invention is a system to convert heat into electricity that includes a metamaterial having a surface that is tuned to generate an enhanced electric field at a desired frequency and a rectenna placed over the enhanced electric field, at a distance to interact with the generated electric field, and to produce electricity from the generated electric field. In an embodiment, the surface of the metamaterial comprises a plurality of holes with dimensions and spacing to cause the surface to generate the enhanced electric field at the desired frequency, and wherein a rectenna is placed over each hole. In another embodiment, the surface of the metamaterial comprises a plurality of posts with dimensions and spacing to cause the surface to generate the enhanced electric field at the desired frequency.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1B:
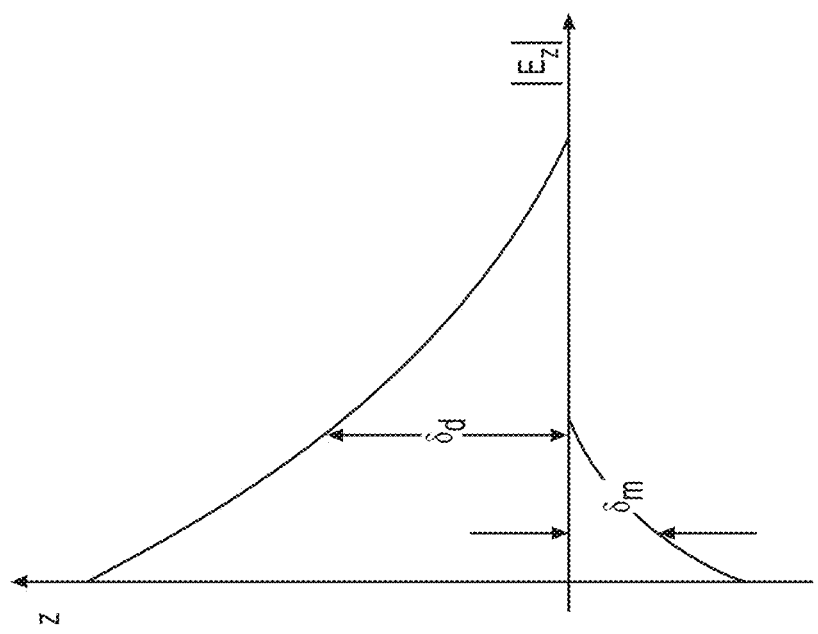
FIG. 1B is a graph of electric field strength as a function of distance above and below the surface in the metal.
Figure 1A:
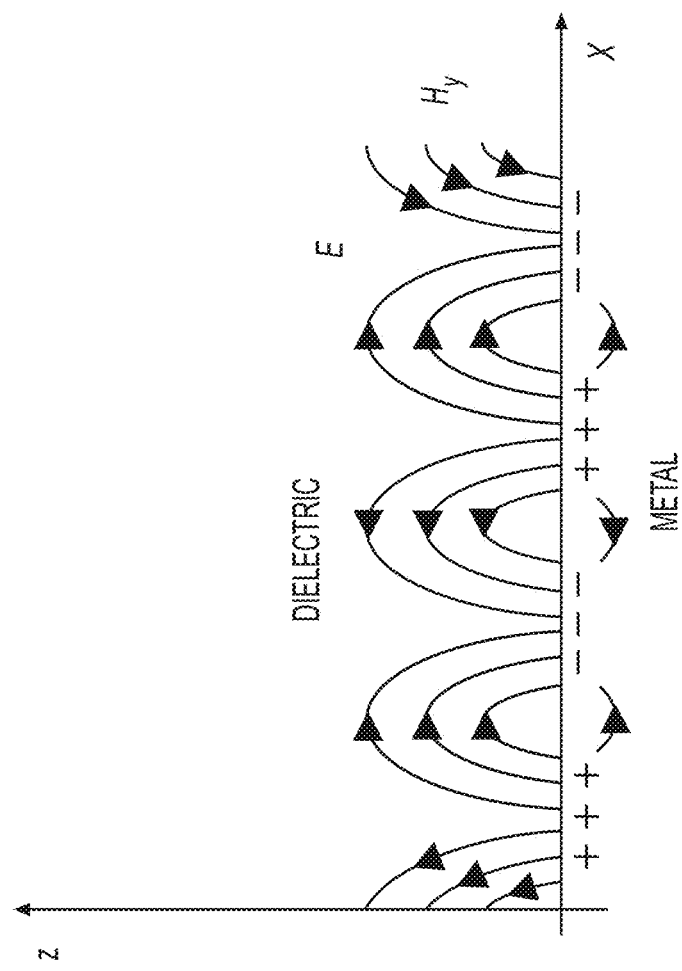
FIG. 1A is a graph of electric field at the surface of a metal supporting surface plasmon resonance
Figure 2:
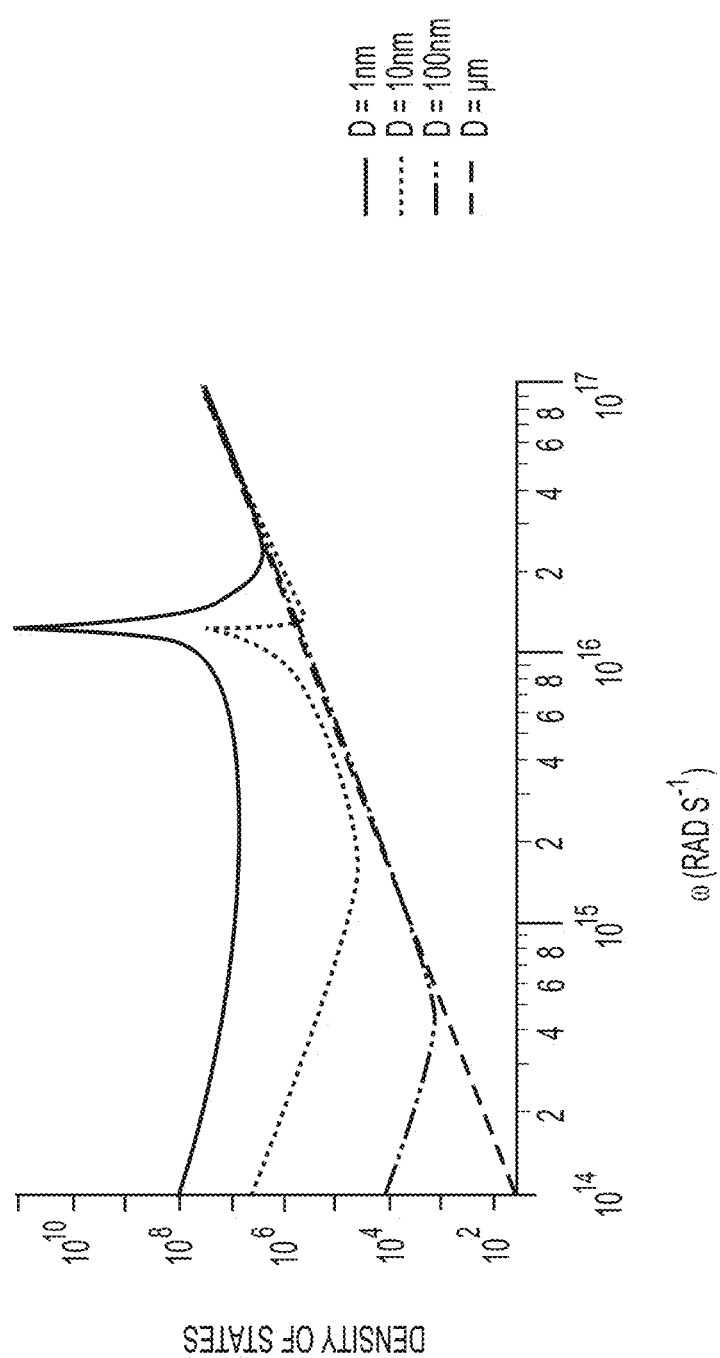
FIG. 2 is a graph illustrating the local density of states versus frequency at different heights above a semi-infinite sample of aluminum.
Figure 3:
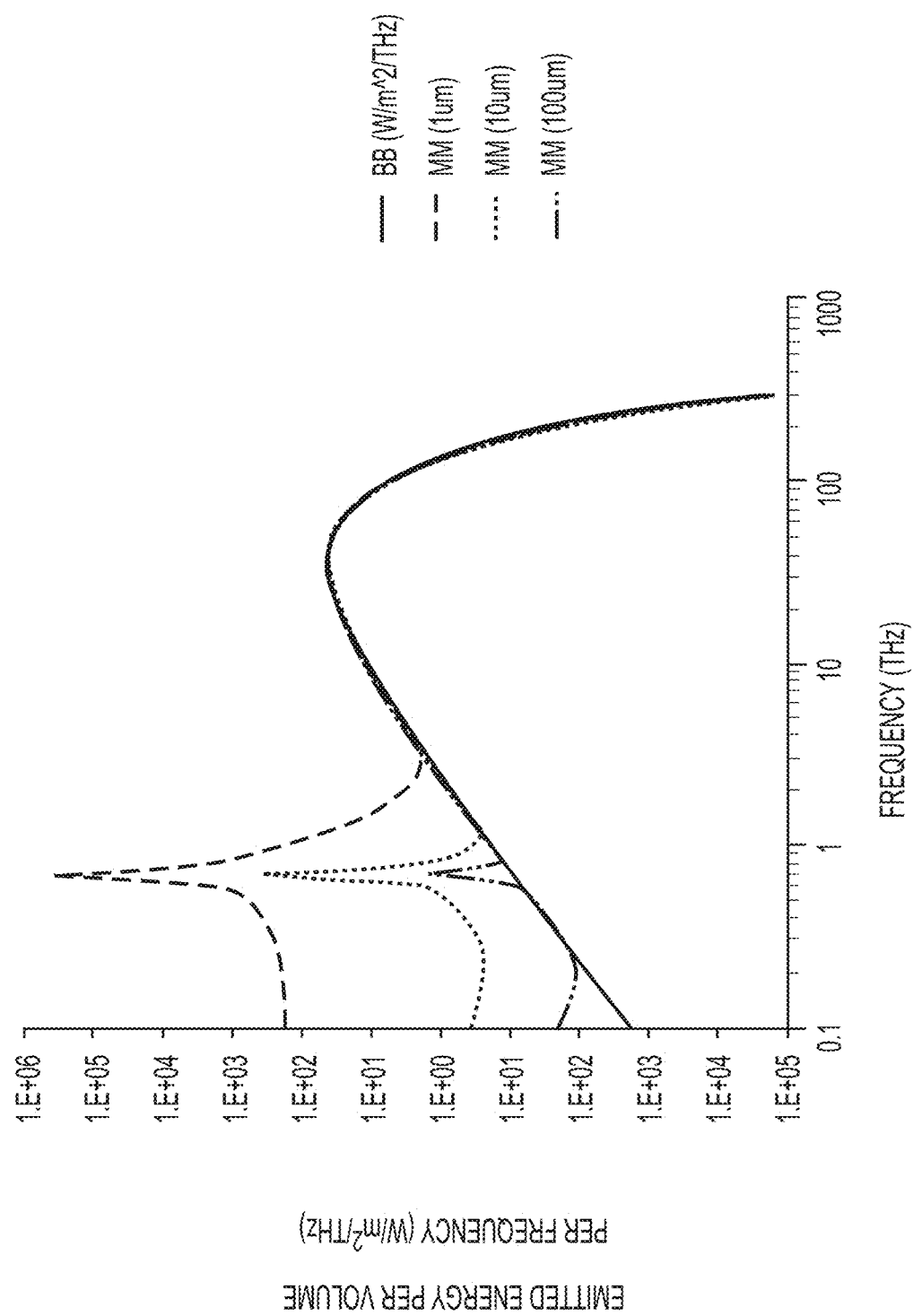
FIG. 3 is a graph illustrating the emitted energy, at various distances from the surface of a metal, per unit volume per unit frequency across a wide spectrum of frequencies.

FIG. 1A is a graph of electric field at the surface of a metal supporting surface plasmon resonance. FIG. 1B is a graph of electric field strength as a function of distance above and below the surface in the metal where $\delta_d$ is the distance above the surface, and $\delta_m$ is the distance below the surface. FIG. 2 is a graph showing the local density of states versus frequency at different heights above a semi-infinite sample of aluminum. The local density of states represents the number of available photon states and the larger local density of states naturally enables higher optical power density. FIG. 2 shows the local density of states is strongly enhanced at the surface plasmon frequency and this means strongly enhanced optical power density may be achieved at that frequency. The surface plasmon frequency of metal is not engineerable. It is thus necessary to adopt the metamaterial concept which allows us to design an artificially structured surface whose surface plasmon frequency can be tuned. FIG. 3 is a graph of the emitted energy, at various distances from the surface of a metamaterial designed to exhibit surface plasmon modes at 1 THz, per unit volume per unit frequency across a wide spectrum of frequencies. It shows strongly enhanced optical energy density at the surface plasmon frequency.

FIGS. 1A, 1B, 2, and 3 demonstrate that a metamaterial can be engineered to generate an electric field having an enhanced field strength at a resonant frequency that is tunable. As described below, in embodiments, a metamaterial is designed to exhibit resonance, and therefore an enhanced electric field, in the presence of frequencies associated with heat. A rectenna is placed in the electric field to convert the energy in the electric filed to electricity. In an embodiment, a rectenna is a device having antenna elements responsive to the electric field and a transfer to device such as a MIM or MIIM diode that converts the radiated energy from the antenna elements to electricity.

Figure 4A:
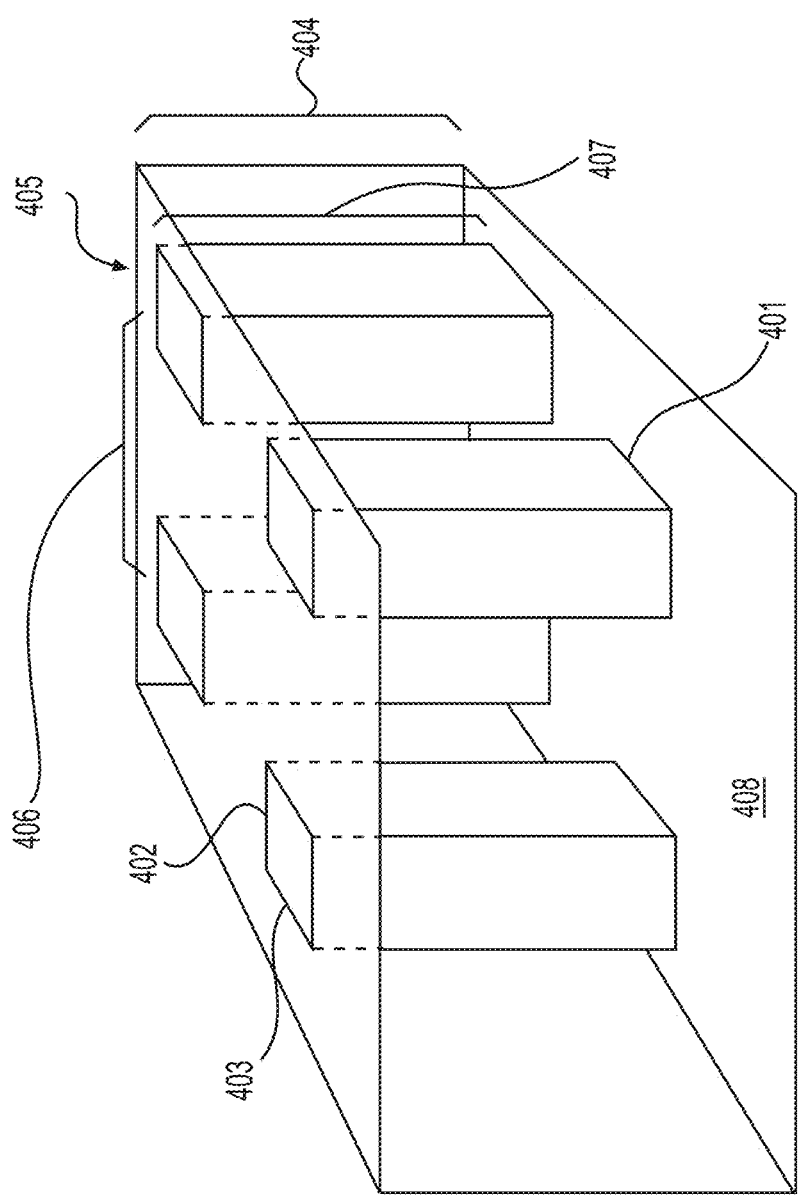
FIGS. 4A and 4B illustrate the inter-relationship of elements of one metamaterial structure that generates plasmonic resonance on the surface of a metal.
Figure 4B:
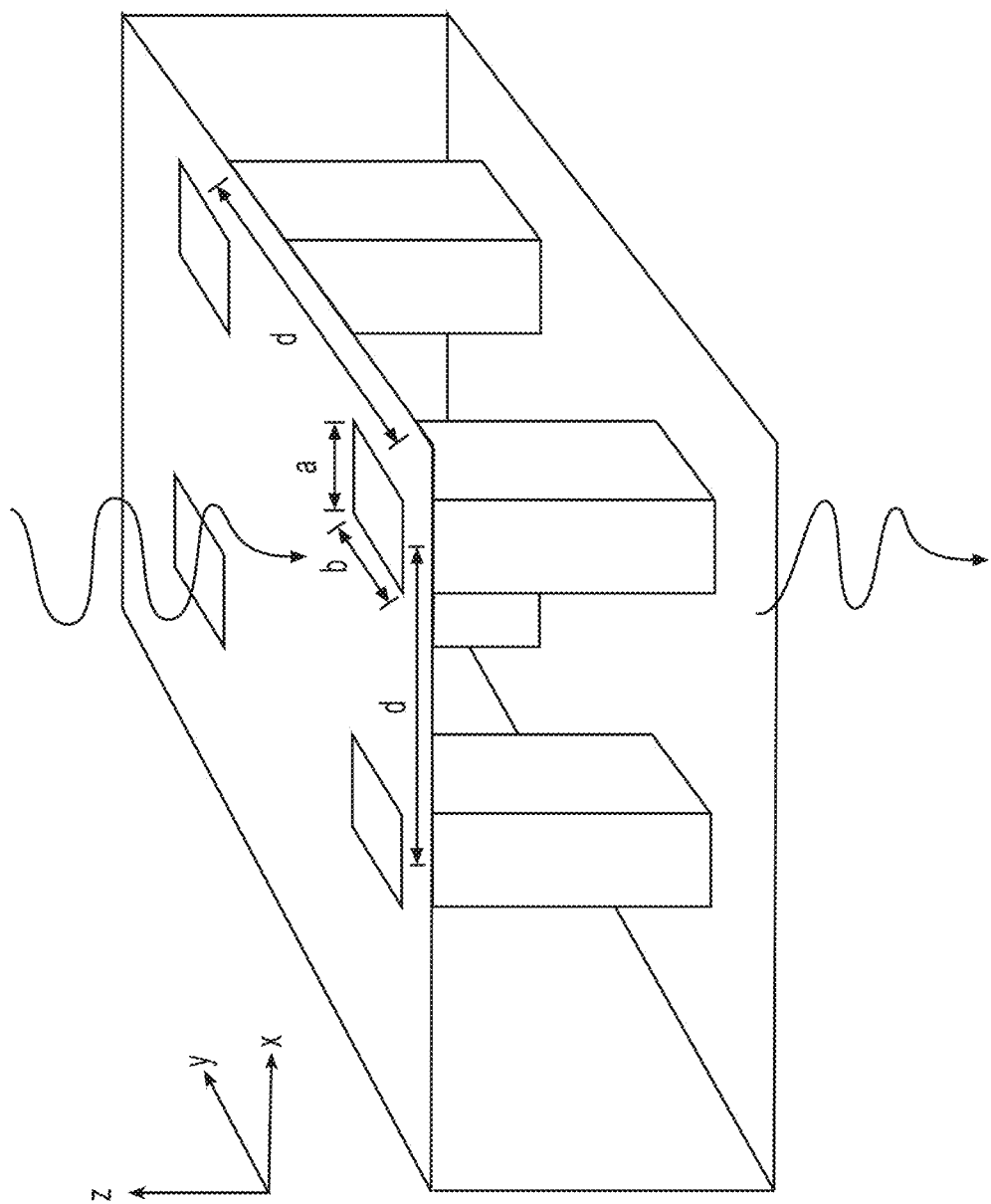

FIGS. 4A and 4B are schematic diagrams of an exemplary metamaterial structure at the surface of a hot object 408. Holes 401 are fabricated in surface 405 using lithographic and etching methods known to those skilled in the art. In an embodiment, the size (or area) of holes 401, represented by dimensions 402 (length) and 403 (width), the spacing 406 between holes 401, and the depth 407 of holes 401 are determined by simulation of electromagnetic waves incident on hot surface 405 and elements of structure 408 so that the metamaterial surface supports a strong surface resonance at or near a desired frequency. In embodiments, the desired frequency is 1 THz. An exemplary such surface resonance near 1 THz is illustrated in FIGS. 2 and 3. In an embodiment, for example, the simulation numerically solves Maxwell's equations with a given geometry. FIG. 4B shows an exemplary geometry used for 3-dimensional simulations in a particular embodiment. In the embodiment, the hole has surface dimensions a and b, to represent width and length respectively. Where dimensions a and b are equal, i.e., the hole is square, resonant frequency can be approximated by:

$$\omega_{pl} = \frac{\pi c_0}{a\sqrt{\varepsilon_H \mu_H}}$$

where $\omega_{pl}$ is the effective plasmon resonant frequency, $c_0$ is the speed of light, a is the size of the holes, $\varepsilon_h$ is the electric permittivity and $\mu_h$ is the magnetic permeability of the material.

Electromagnetic waves such as light exhibit polarization. Various states of polarization can occur from environmental/material boundary conditions that induce scatter and absorption. Metamaterials can be designed to respond and extract energy from various modes of polarization. For example, if dimensions a and b are not equal, i.e., the hole is rectangular, the metamaterial becomes anisotropic and exhibits difference responses to different polarizations. Similarly in an embodiment, spacing d in the x direction may be different than spacing d in the y direction. Where spacing d is different in the x and y directions, the metamaterial becomes anisotropic and exhibits difference responses to different polarizations.

Figure 5A:
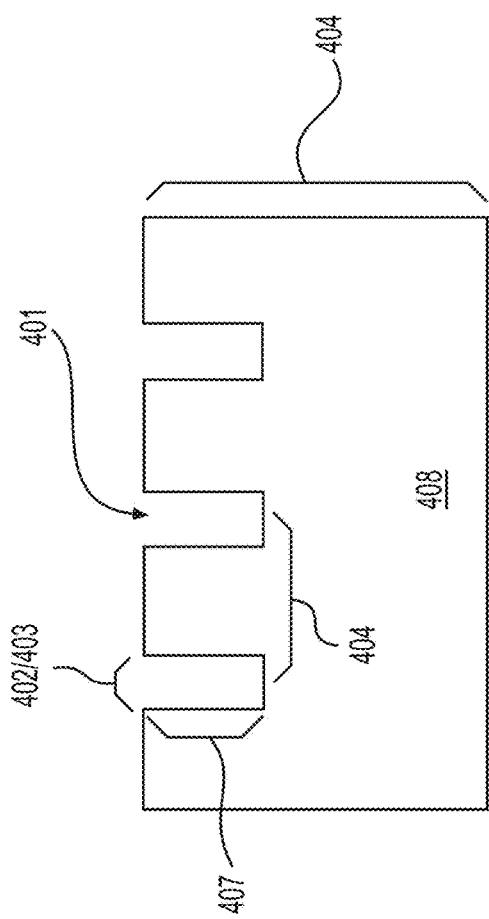
FIGS. 5A and 5B illustrate a cross sectional view of the metamaterial structure elements.
Figure 5B:
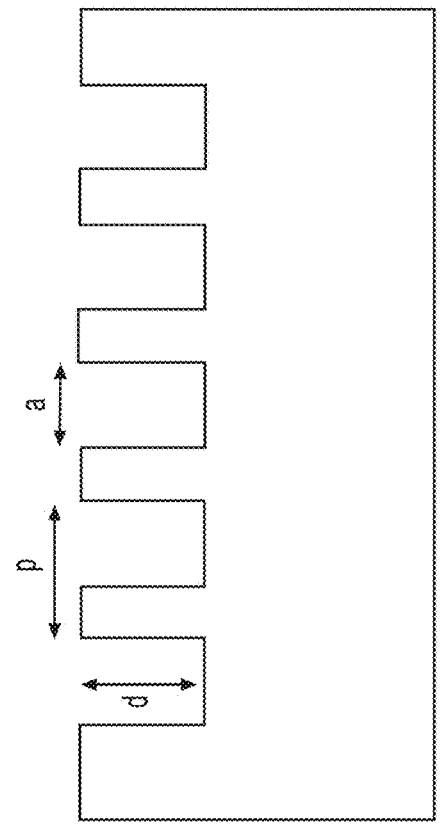

FIGS. 5A and 5B illustrate an exemplary geometry used for a 2-dimensional simulation to determine hole dimensions and hole spacing to achieve a desired resonant frequency according to an embodiment. In an embodiment, hole spacing and dimension form a periodic structure of holes 401 in metamaterial 408. As such, the exemplary simulation can be simplified by using a computational cell containing only one unit cell with a periodic boundary condition. For the direction perpendicular to the metamaterial surface, an absorbing boundary condition was used to simulate the infinite extent of the medium. In FIG. 5A, the dimensions are designated by 402, 403, and 407 for length, width, and depth respectively, with a hole spacing 406. In FIG. 5B, the dimensions are designated as a (area of the hole), d (depth of the hole), and p (hole spacing).

In a typical simulation, a plane wave with a fixed wavelength is launched onto the metamaterial surface and the subsequent reflected power is calculated. This simulation is repeated over a range of wavelengths to obtain a reflectance spectrum. The reflectance spectrum should exhibit a dip at the wavelength of surface plasmon resonance. The geometry (dimensions and spacing of the holes) of metamaterial surface is then tuned to shift the resonance dip in the reflectance spectrum into the desired wavelength. Full optimization should also include minimizing the line width and maximizing the depth of the reflection dip because these conditions correspond to the strongest resonance.

In the simulation using the plane wave as described above, the incident wave must couple to the surface wave in order to produce a dip in the reflectance spectrum. This is achieved by the periodicity of the holes which acts as a grating and imparts a momentum necessary for coupling to the surface wave. Specifically, the grating coupling condition is given as:

$$\beta = \frac{2\pi}{\lambda}\sin\theta + \frac{2\pi}{\rho}$$

where $\lambda$, $\theta$, and $\rho$ are the wavelength, incident angle and grating period, respectively. When the propagation constant $\beta$ matches that of the surface wave, the incident wave will couple to the surface wave, resulting in a dip in the reflectance spectrum.

While coupling occurs whenever this condition is met, the coupling efficiency may vary. Thus some structures may not show prominent reflectance dips even though surface waves do exist. In order to avoid missing surface waves due to poor coupling efficiency, dipole sources are used in the simulation. Dipole sources are basically harmonically oscillating point dipoles. An oscillating point dipole produces an electromagnetic wave emanating isotropically. By placing many point dipole sources on the metamaterial surface coupling into the surface wave is ensured. In this case, the existence of surface wave would be detected by monitoring the electric and magnetic field patterns near the surface. A strong enhancement of field intensity near the surface signifies the presence of surface wave.

Resonances form on the surface of material 408 at the tuned frequency of interest. In an embodiment, this frequency is 1 THz. Materials 408 can be a variety of materials, including, for example, copper, or any other highly conductive material. Other materials may be used if design dimensions are recalculated by simulation as described above. In an embodiment, metamaterial 408 is copper with a thickness of 100 μm. Dimensions for the embodiment are 10 μm for hole length 402, 10 μm for hole width 403, 50 μm for hole spacing 406 and 40 μm for hole depth 407.

Figure 6B:
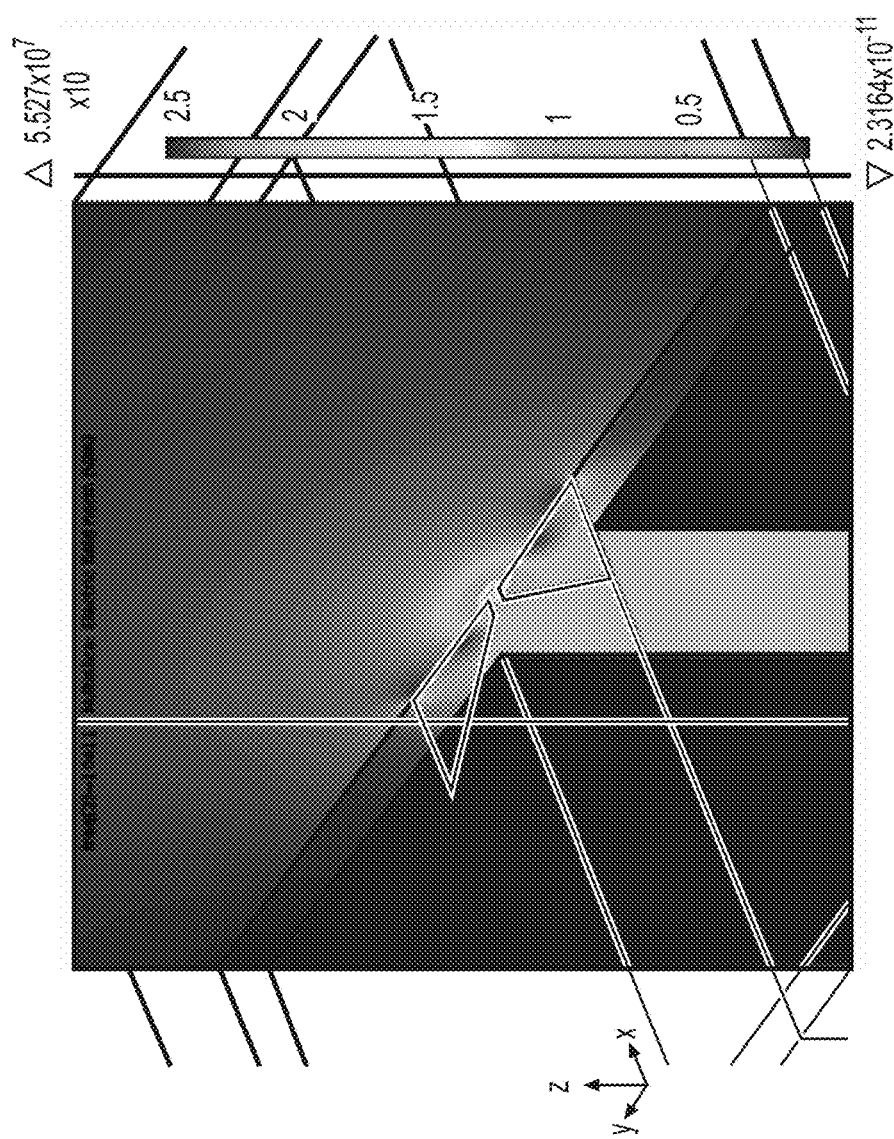
FIGS. 6A and 6B illustrate a 3-dimensional view of electric field strength simulation results for a rectenna placed near one of the holes in the surface of a metamaterial.
Figure 6A:
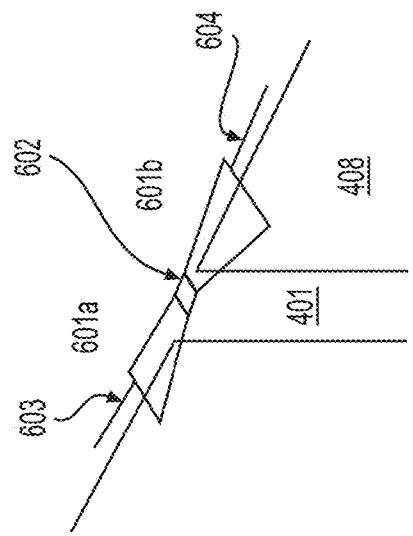

FIGS. 6A and 6B illustrate schematically a rectenna 601 placed over a hole 401 with field intensity mapping. Rectenna 601 comprises antenna elements 601a and 601b, and a diode 602. Placing rectenna over a hole 401 in the surface of a metamaterial as shown in FIGS. 6A and 6B is to deliver a concentrated electric field to antenna elements 601 and thereby to diode 602, where harvesting of radiant energy to electricity occurs. Once radiant heat energy is harvested it is carried to a bus structure via leads 603 and 604, and can be used to power electronic devices or to electricity storage facilities. Additional details for rectenna 601 are described in the '481 Application, the '138 Application and the '175 Application.

Figure 7:
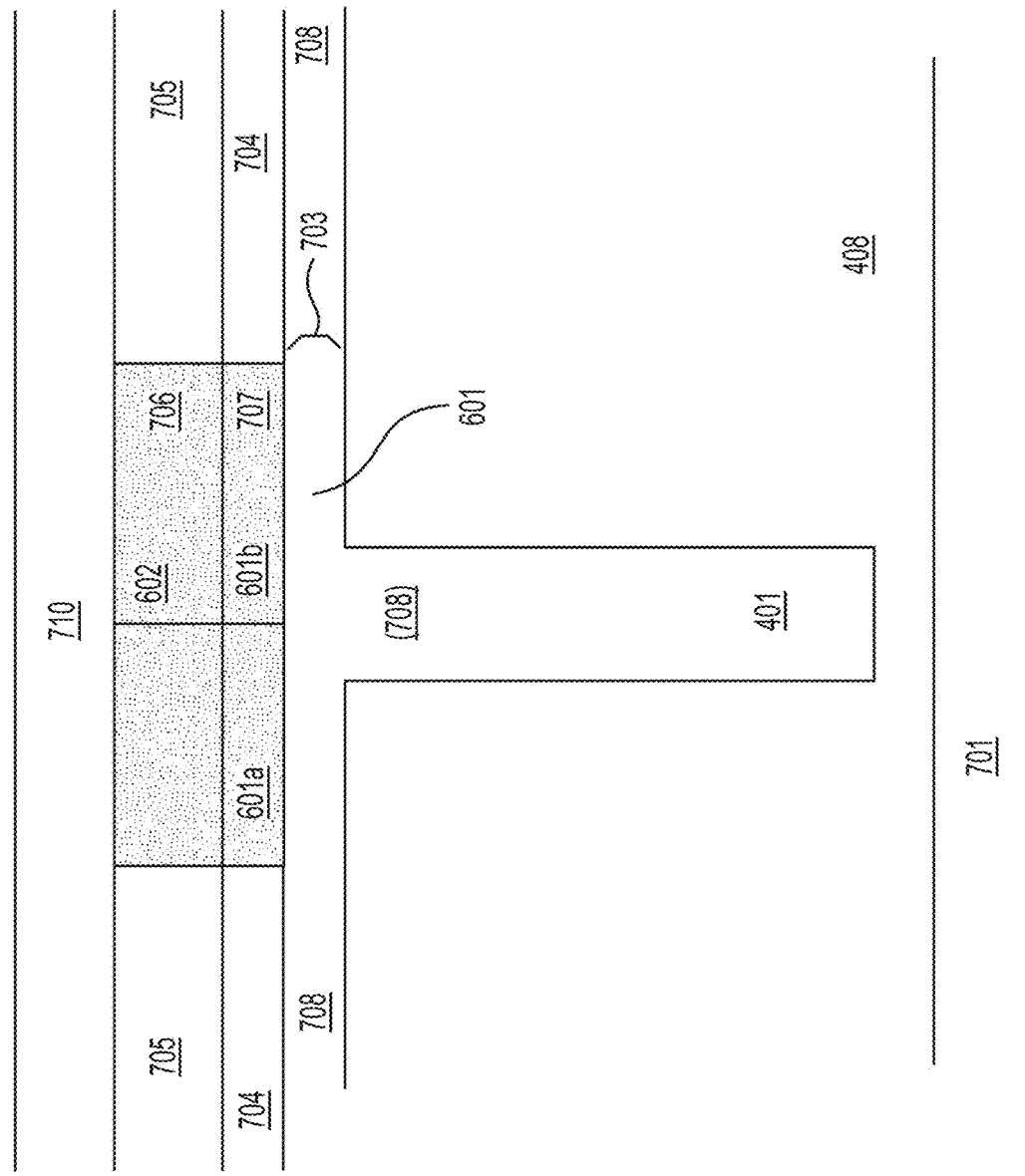
FIG. 7 is a cross sectional view of a metamaterial structure with a rectenna placed at the structure aperture.

FIG. 7 illustrates a cross sectional view of a metamaterial 408 with a rectenna 601 that comprises antenna elements 601a and 601b and a diode 602. In the embodiment shown in FIG. 7, hole 401 is filled with a highly insulating material 708. Exemplary highly insulating materials 708 include SUB, Aerogel, air, and vacuum. Material 708 must be insulating but transparent to radiation. Rectenna 601 is set at a distance 703 from the surface of the metamaterial 408. This distance is important since the power of the electric field decreases exponentially with distance from the surface. In one embodiment the distance is at or approximately 3 μm which offers a good balance of thermal insulation and proximity for field strength. In another embodiment, rectenna 601 is placed in the near-field over hole 401 at less than 0.5 wavelengths of the specific frequency that causes surface resonance. In an embodiment with a plurality of holes 401, a rectenna 601 is placed over each hole 401. In an embodiment with a plurality of holes 401, a rectenna is placed over some, but not all, holes 401.

Materials 706 and 707, on top of rectenna 601, conduct heat and couple the rectenna 601 to a cold source 710. Materials 704 and 705, which surround rectenna 601, are insulating to prevent lost heat from the source 701 and serve to guide heat via radiation to rectenna 601.

Figure 8:
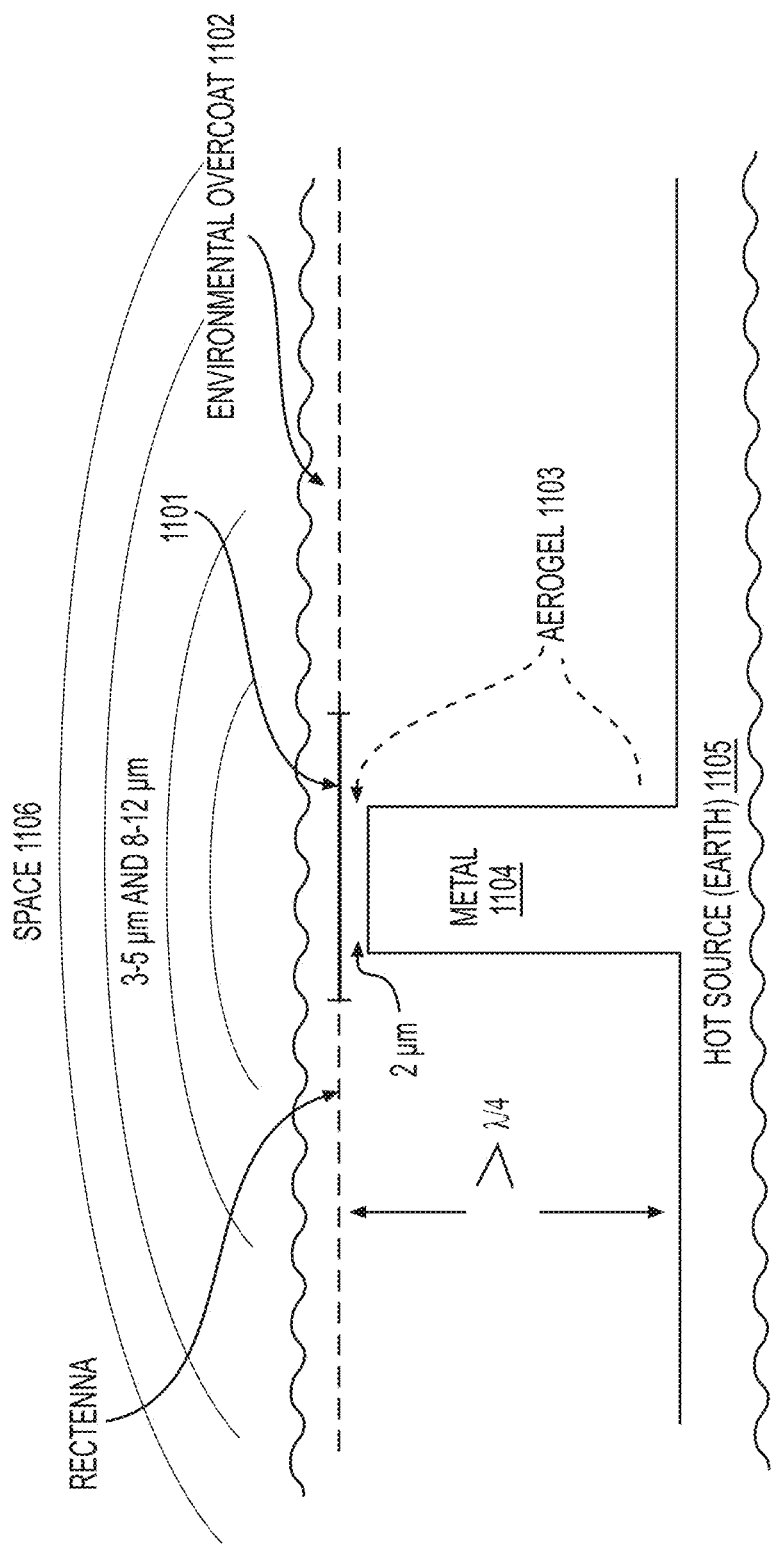
FIG. 8 illustrates a cross sectional view of a system that can harvest the earth's heat.

FIG. 8 illustrated an embodiment of the present invention that is configured to harvest heat from the Earth in the context of the low temperature of deep space. In such embodiment, deep space acts as the cooling source for a rectenna 1101. As shown in FIG. 8, rectenna 1101 is placed in the near field of post metamaterial structure 1104. Post structure 1104 concentrates the electric field, generated by a surface from heat delivered by a terrestrial source (e.g., Earth), and delivers this electric field at a frequency set by the design of the surface metamaterial structures using a simulation as described above. To maximize the Carnot system advantages of this system it is desirable to tune rectenna 1101 to a frequency in a clear band of the Earth's atmosphere. Two such bands are well known: 3 μm to 5 μm and 8 μm to 12 μm. Rectennas tuned in this band will radiate freely with the cold source of deep space and create a system whose Carnot zone is nearly 100% (C=1−Tc/Th; where Tc=3K and Th=300K).

In an embodiment using deep space as a cold source, as shown in FIG. 8, the metamaterial is in the form of a plurality of posts 1104, rather than holes 401, one of which is shown in FIG. 8. In an embodiment, a plurality of posts are placed periodically as described above for holes 401. Post 1104 is surrounded by a heat insulating and radiation transparent material 1103. An exemplary such material 1103 is Aerogel. In another embodiment, material 1103 is replaced with a vacuum to optimize thermal insulation properties. In an embodiment, rectenna 1101 is placed at or approximately 2 μm above post 1104. In another embodiment, a rectenna 1101 is placed in the near-field over post 1104 at less than 0.5 wavelengths of the specific frequency that causes surface resonance. In an embodiment, a rectenna 1101 is placed over some but not all posts 1104. In an embodiment, post 1104 is at least the height of ¼ wavelength of the tuned frequency of rectenna 1101. Post design 1104 allows an element of rectenna 1101 to radiate into space 1106 since it is more than a quarter wavelength away from the surface of the metal. The combination of near proximity to post 1104 and greater than quarter wavelength to the surface metal 1105 allows rectenna 1101 to receive energy from the tuned metamaterial 1104 yet still radiate into deep space 1106.

It is advantageous for the tuned frequency of rectenna 1101 to equal the tuned frequency of the metamaterial 1104 so surface plasmons will deliver energy most efficiently to the rectennas 1101. Also, rectennas 1101 need to be tuned within the clear band regions of the atmosphere.

The system illustrated in FIG. 8 harvests energy as electricity since rectenna 1101 is stimulated into oscillation by terrestrial heat. A source of efficiency in embodiments results from the reflection of energy coming from nearby terrestrial sources that is in the bands outside the clear atmospheric windows. The system needs to reflect away this "out of band" energy for rectenna 1101 to stay cooled by deep space 1106.

This is part of the purpose of environmental overcoat 1102. Environmental overcoat 1102 is heat insulating and radiation transparent in the "in band" wavelengths of the atmosphere, i.e., in the clear band. Directionality is also an important factor in design. Because the system is in contact with the sky, rectennas 1101 need to be pointed toward the sky and not obscured by intervening objects.

Figure 9:
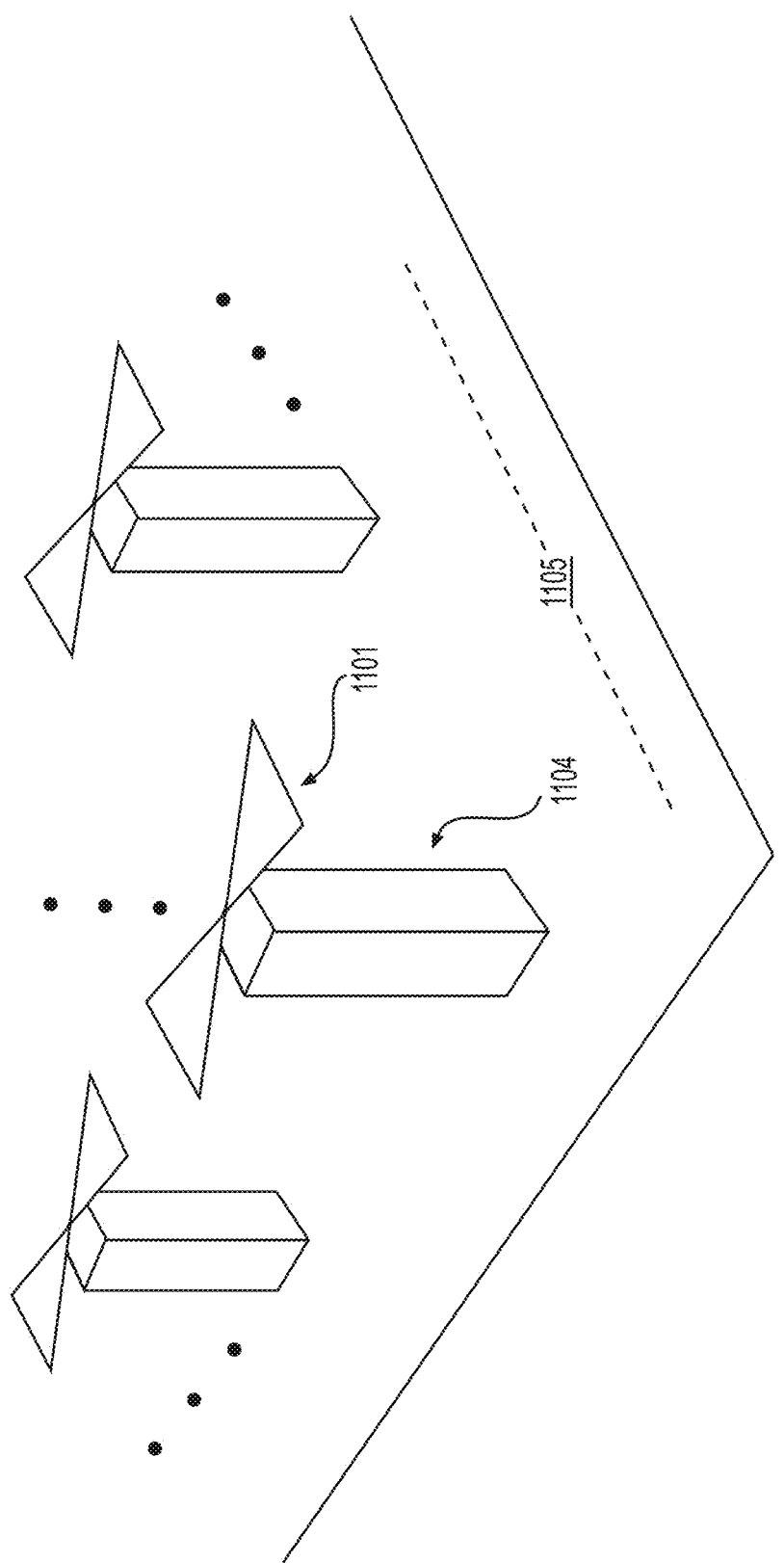
FIG. 9 illustrates a 3-dimensional view of the system of FIG. 8.

FIG. 9 illustrates a plurality of such elements. Metamaterial posts 1104 on surface 1105 create the plasmonic structure that concentrates a plasmonic electric field at the tips of the post structures. Rectennas 1101 are placed in the near field of this structure and tuned for near field resonance at the plasmonic frequency. The tuning of rectenna 1101 must also match a portion of the transparent window in the atmosphere.

If an antenna is substituted for rectenna 1101 in the embodiment illustrated in FIGS. 8 and 9, the system converts heat energy to radiation at the tuned frequency of the antenna. Such a system has significant advantages for use as an inexpensive source of THz radiation. In particular, surfaces covered with THz tuned antennas (matched to tuned metamaterial 1104) generate THz radiation at very low cost. The entire THz range can be generated by covering a surface 1105 with subregions of the surface tuned to subregions of the THz spectrum (both antennas and metamaterials).

Figure 10:
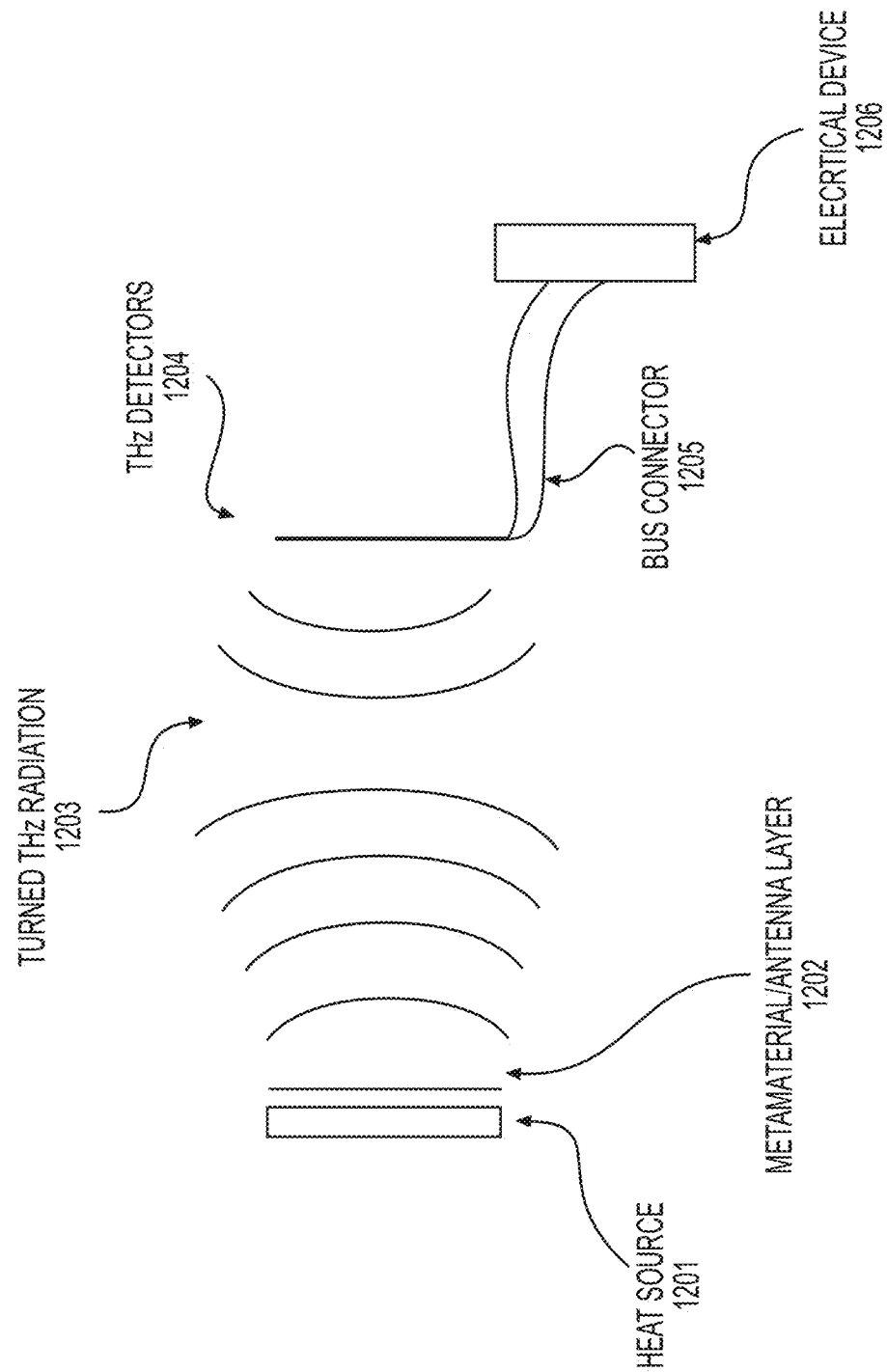
FIG. 10 illustrates an embodiment in which THz sources are matched up with THz sensors to provide electrical output carried via an electrical bus to provide power to an electrical device.

FIG. 10 illustrates a system for generating THz radiation according to an embodiment. THz sources layers 1202 are matched up with THz sensors 1204. THz source layers 1202 and THz sensors 1204 can be as those described in the '481 Application, the '138 Application and the '175 Application.

As illustrated in FIG. 10, a heat source 1201 generates heat. A THz source layer 1202 comprises a THz metamaterial and an antenna tuned to THz frequencies. In response to the heat generated by heat source 1201, the metamaterial in THz source layer 1202 generates energy at the tuned THz frequencies. The antenna devices in THz source layer 1202, which are also tuned to the THZ frequencies, radiate THz radiation to THz detectors 1204. THz detectors 1204 respond to the radiated THz radiation to provide electrical output carried via electrical bus 1205 to provide power to an electrical device, for example, a computer 1206, which can include, among other things, for example, digital processing capabilities, storage, and display. In an embodiment, THz sources 1202 are such as described above with respect to the antenna variation described above with respect to FIGS. 8 and 9. This system provides active illuminated THz detection at low cost at standoff distances. Both the THz sources 1202 and detectors 1204 are tunable within the THz range so such a system is highly flexible and deployable to a variety of applications.

What is claimed is:
1. A system for harvesting electricity from electromagnetic radiation, comprising:
  a metamaterial that is heated by a heat source and has a surface that is tuned to generate an electric field at a tuned frequency; and a rectenna, placed over the electric field at a distance to interact with the electric field, that includes:
an antenna element that is configured to resonate at the tuned frequency to generate an electron flow; and
a transfer element that is configured to receive the electron flow and output electricity.

2. The system recited in claim 1, wherein the surface of the metamaterial has a plurality of holes over each of which an electric field is concentrated when the metamaterial is heated.

3. The system recited in claim 2, wherein there are one or more rectenna, and each rectenna is placed in the near field over one or more of the plurality of holes.

4. The system recited in claim 3, wherein the rectenna are placed with 3 μm over one or more of the plurality of holes.

5. The system recited in claim 3, wherein the rectenna are placed within one half the tuned frequency wavelength over one or more of the plurality of holes.

6. The system recited in claim 3, wherein the rectenna are tuned to 1 THz.

7. The system recited in claim 2, wherein each hole is circular has a depth of approximately 40 μm, the spacing between holes is approximately 50 μm, and each hole has a diameter of approximately 10 μm.

8. The system recited in claim 2, wherein each hole is square has a depth of approximately 40 μm, the spacing between holes is approximately 50 μm, and each side has a length of approximately 10 μm.

9. The system recited in claim 1, wherein the components of the system are configured to be manufactured using roll-to-roll technology.

10. The system recited in claim 2, wherein each hole is square with a side length of a, and the tuned frequency $\omega_{pl}$, is determined as:

$$\omega_{pl} = \frac{\pi c_0}{a\sqrt{\varepsilon_H \mu_H}}.$$

11. The system recited in claim 2, wherein the distribution of plurality of holes is periodic.

12. The system recited in claim 1, wherein the surface is tuned using a simulation to obtain a reflectance spectrum and tuning the surface to achieve a dip in the reflectance spectrum at the tuned frequency.

13. The system recited in claim 1, wherein the surface is tuned using a simulation to obtain a reflectance spectrum and tuning the surface by adjusting the dimensions and spacing of the holes to achieve a dip in the reflectance spectrum at the tuned frequency.

14. The system recited in claim 12, wherein tuning the surface further comprises minimizing the width of the dip and maximizing the depth of the dip.

15. The system recited in claim 13, wherein tuning the surface further comprises minimizing the width of the dip and maximizing the depth of the dip.

16. The system recited in claim 1, wherein the metamaterial is copper.

17. The system recited in claim 1, wherein the metamaterial has a thickness of 50 μm.

18. The system recited in claim 2, wherein each hole is filled with a highly insulating material that is transparent to radiation.

19. The system recited in claim 1, wherein materials on top of the rectenna couple the rectenna to a cold source.

20. The system recited in claim 1, wherein the surface of the metamaterial has a plurality of posts over each of which an electric field is concentrated when the metamaterial is heated.

21. The system recited in claim 20, wherein the tuned frequency is in the clear band of the Earth's atmosphere.

22. The system recited in claim 20, wherein each post is surrounded by a material that is heat insulating and radiation transparent.

23. The system recited in claim 20, wherein there are one or more rectenna, and each rectenna is placed over a post.

24. The system recited in claim 23, wherein there is a rectenna placed over each post.

25. The system recited in claim 20, wherein the rectenna are placed approximately 2 μm over the posts.

26. The system recited in claim 20, wherein the height of each post is at least one quarter of the tuned frequency wavelength.

27. The system recited in claim 20, further comprising an environmental overcoat that is heat insulating and radiation transparent in the clear band of the Earth's atmosphere.

28. The system recited in claim 23, wherein each rectenna is pointed toward that sky.

* * * * *